(12) United States Patent
Ljungberg

(10) Patent No.: US 8,409,733 B2
(45) Date of Patent: Apr. 2, 2013

(54) COATED CUTTING TOOL

(75) Inventor: Björn Ljungberg, Enskede (SE)

(73) Assignee: Sandvik Intellectual Property AB, Sandviken (SE)

( * ) Notice: Subject to any disclaimer, the term of this patent is extended or adjusted under 35 U.S.C. 154(b) by 581 days.

(21) Appl. No.: 12/441,215

(22) PCT Filed: Sep. 7, 2007

(86) PCT No.: PCT/EP2007/059376
§ 371 (c)(1),
(2), (4) Date: Nov. 16, 2009

(87) PCT Pub. No.: WO2008/031768
PCT Pub. Date: Mar. 20, 2008

(65) Prior Publication Data
US 2010/0061812 A1   Mar. 11, 2010

(30) Foreign Application Priority Data

Sep. 15, 2006 (SE) ........................ 0601950

(51) Int. Cl.
*B32B 15/04* (2006.01)
*C23C 14/00* (2006.01)

(52) U.S. Cl. .................. 428/698; 407/119; 407/113

(58) Field of Classification Search .................. 407/113, 407/119; 82/1.11; 428/698, 699; 51/307, 51/309
See application file for complete search history.

(56) References Cited

U.S. PATENT DOCUMENTS 5,250,367 A * 10/1993 Santhanam et al. .......... 428/698
5,364,209 A * 11/1994 Santhanam et al. .......... 407/119
5,722,803 A *  3/1998 Battaglia et al. .............. 407/119
5,976,707 A * 11/1999 Grab .............................. 428/547
6,612,787 B1 *  9/2003 North et al. .................... 407/119
6,884,496 B2     4/2005 Westphal et al.
2007/0009763 A1  1/2007 Littecke et al.
2009/0068371 A1  3/2009 Littecke et al.

FOREIGN PATENT DOCUMENTS

EP         1 696 051      7/2008
JP         6-57409        3/1994

(Continued)

OTHER PUBLICATIONS

Noyan et al., "Residual Stress—Measurement by Diffraction and Interpretation," New York: Springer-Verlag, pp. 117-130 (1987).
Notice of Reasons for Rejection against JP2009-527790, dated Nov. 22, 2011.

(Continued)

*Primary Examiner* — Will Fridie, Jr.
(74) *Attorney, Agent, or Firm* — Morgan, Lewis & Bockius LLP

(57) ABSTRACT

The invention relates to a method of producing a cutting tool at least partly coated with an inner CVD coating and an outer PVD coating comprising the manufacturing steps of depositing the CVD coating, subjecting the CVD coating at least partly to an intensive wet-blasting operation, followed by depositing the PVD coating.

The invention also relates to a coated cutting tool comprising a cemented carbide substrate of 5-14 wt-% Co, 0-8 wt-% cubic carbides of Ti, Ta or Nb or a combination thereof, and balance WC, said substrate being at least partly coated with a 4-14 μm thick coating comprising an inner CVD coating and an outer PVD coating wherein the CVD coating has compressive stresses.

9 Claims, 1 Drawing Sheet

FOREIGN PATENT DOCUMENTS

| | | |
|---|---|---|
| JP | 3269305 | 3/2002 |
| JP | 2004-268251 | 9/2004 |
| JP | 2006-192545 | 7/2006 |
| SE | 528 696 | 1/2007 |
| SE | 529 023 | 4/2007 |
| WO | WO 02/077312 | 10/2002 |
| WO | WO 2006/023222 | 3/2006 |

OTHER PUBLICATIONS

Sato et al., "Effects of Shot Peening on CVD-Coated Cemented Carbide," Proceedings of the International Conference on Processing Materials for Properties, Nov. 7, 1993, pp. 1145-1148.

* cited by examiner

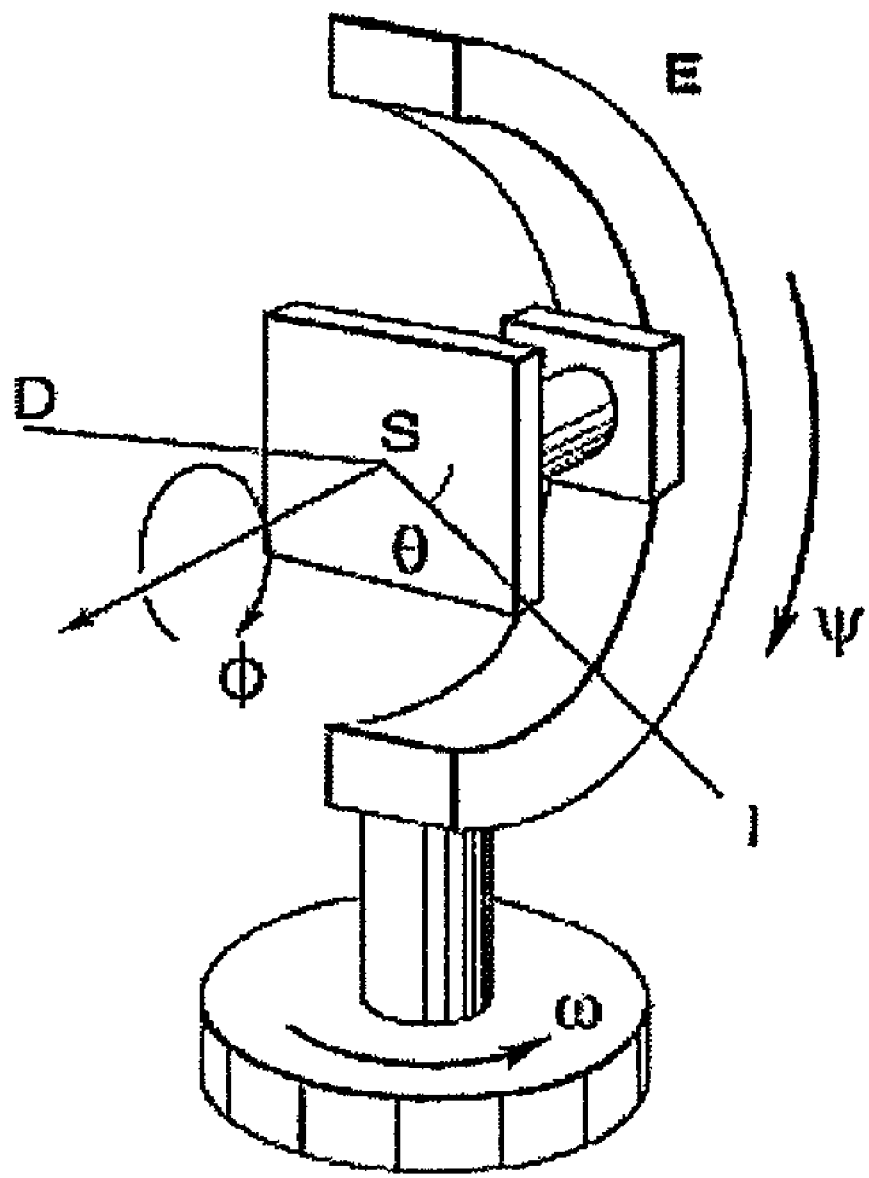

COATED CUTTING TOOL

The present invention relates to a coated cutting tool suitable for machining of metals by turning, milling, drilling or by similar chip forming machining methods. The coated tool shows improved toughness behaviour especially when used in interrupted cutting operations. The coating consists of at least one inner layer coated by CVD-technique and at least one top layer coated by PVD-technique. All layers in the coating possess compressive stresses.

Modern high productivity chip forming machining of metals requires reliable tools with high wear resistance, good toughness properties and excellent resistance to plastic deformation. This can be achieved by employing a cemented carbide tool coated with a wear resistant coating. The cemented carbide tool is generally in the shape of an indexable insert clamped in a tool holder, but can also be in the form of a solid carbide drill or a milling cutter. Cemented carbide cutting tool inserts coated with various types of hard layers like TiC, $Ti(C_xN_y)$, TiN, $(Ti_xAl_y)N$, $Ti(C_xO_yN_z)$ and $Al_2O_3$ have been commercially available for many years. Several hard layers in a multilayer structure generally build up such coatings. The sequence and the thickness of the individual layers are carefully chosen to suit different cutting application areas and work-piece materials.

The coatings are most frequently deposited by Chemical Vapour Deposition (CVD) or Physical Vapour Deposition (PVD) techniques. In some rare cases also Plasma Assisted Chemical Vapour Deposition (PACVD) has been practised. CVD-coated inserts show high wear resistance and excellent coating adhesion while PVD coated inserts are slightly inferior with respect to these properties, but on the other hand possess much better toughness behaviour. Hence, CVD-coated inserts are preferred in high speed turning operations and PVD-coated inserts are used in toughness demanding cutting operations like milling, parting and drilling.

The CVD technique is most often conducted at a rather high temperature range, 850-1050° C. Due to the high deposition temperature and to a difference in thermal coefficient of expansion between the deposited coating materials and the cemented carbide tool substrate, CVD produces coatings with cooling cracks and rather high tensile stresses, often in the range 500 to 700 MPa. The tensile stress state lowers the toughness behaviour of a CVD-coated insert. PVD processes run at a significantly lower temperature, 450-650° C. and are conducted under strong ion bombardment which leads to crack free layers with high compressive stresses often in the range 1400 to 2000 MPa. The high compressive stresses and the absence of cooling cracks are the main features that make PVD coated inserts considerably tougher than CVD-coated inserts. It is at present not possible by PVD to produce $Ti(C_xN_y)$ layers with high carbon content and with the same high abrasive wear resistance and excellent adhesion as are obtained by CVD e.g. the well-known MTCVD-process.

The toughness of a CVD-coated insert can be improved by blasting the insert e.g. with hard grits as been disclosed in Swedish patent applications SE 0501410-5 and SE 0500435-3 and is also disclosed in EP-A-1311712. However, the achieved toughness is still far from those of PVD-coated inserts.

It has earlier been attempted to combine the different properties of CVD and PVD coatings in CVD+PVD coatings. Combinations of this kind are disclosed in U.S. Pat. No. 5,250,367 and U.S. Pat. No. 5,364,209.

It is an object of the present invention to provide a method for making a coated cutting tool with improved toughness properties while maintaining the wear resistance.

It is a further object of the present invention to provide coated cutting tool with improved toughness properties while maintaining the wear resistance.

It has now surprisingly been found that it is possible to manufacture a cutting tool which simultaneously has all the good properties of both PVD-coated tools and CVD-coated tools. That is, toughness comparable to PVD-tools (compressive stresses) and a coating adhesion and a wear resistance comparable to that of CVD-coated tools.

FIG. 1 shows a goniometer setup for the evaluation of residual stress by X-ray measurements in which
E=Euler ¼-cradle
S=sample
I=incident X-ray beam
D=diffracted X-ray beam
θ=diffraction angle
ω=θ
ψ=tilt angle along the Euler ¼-cradle
Φ=rotation angle around the sample axis According to the invention there is provided a method of producing a cutting tool at least partly coated with an inner CVD coating and an outer PVD coating comprising the manufacturing steps of depositing the CVD coating, subjecting the CVD coating at least partly to an intensive wet-blasting operation, followed by depositing the PVD coating. The invention can be applied on cutting tools suitable for machining of metals by turning, milling, drilling or by similar chip forming machining methods, such as cutting tool inserts and rotary cutting tools.

To obtain improved toughness properties of a cutting tool coated with wear resistant layer(s) it has according to the invention been found that it is necessary to follow a strict manufacturing procedure. Onto a cemented carbide substrate of 5-14 wt-% Co, 0-8 wt-% cubic carbides of Ti, Ta or Nb or a combination thereof, and balance WC, an inner 2-7 μm thick CVD coating, preferably comprising one or more hard $Ti(C_xN_y)$ layers where x+y=1 and x and y>=0 and preferably $0.5 \leq x \leq 0.6$ and $0.4 \leq y \leq 0.5$, is deposited, preferably at a reasonably low temperature 750-850° C., most preferably by the well-known MTCVD-technique using $CH_3CN$ as the C/N-source. The coating is then preferably heat-treated at 980 to 1030° C. for 1-4 hours in an $H_2/N_2$-atmosphere. This has been found to be an advantageous step as this promotes diffusion of elements into the CVD layer and thereby enhance coating adhesion. Additionally, other CVD layers can be deposited in the CVD coating, such layers can be composed of metal nitrides, carbides or oxides or mixtures thereof with the metal elements selected from Ti, Nb, Hf, V, Ta, Mo, Zr, Cr, W and Al, e.g., TiN, $Ti(C_xO_y)$, TiC, $Ti(C_xO_yN_z)$ or TiBN.

The so produced coating is then subjected to an intensive wet-blasting operation, preferably at least on the rake face, in order to obtain a change in the stress state of the CVD coating from tensile to compressive stresses. For an embodiment having one or more hard $Ti(C_xN_y)$ layers, it is required that compressive stresses in the range 600 to 1600 MPa for these $Ti(C_xN_y)$ layers are obtained, preferably at least on the rake face. The aim of the wet-blasting operation is also to close the cooling cracks at the coating surface. For the used blasting technique the blasting medium can preferably be a slurry of $Al_2O_3$ grits in water. The impact force is controlled by the blasting pulp pressure, the distance between blasting nozzle and coating surface, grain size of the blasting medium, the concentration of the blasting media and the impact angle of the blasting jet. The grit size of $Al_2O_3$ used is preferably FE220 (FEPA-standard) and used air blasting pressure in the range 2.4 to 3.4 bars. Appropriate blasting conditions should be selected by the skilled person so the desired compressive stress levels are achieved for the used CVD-material and coating thickness.

The tools are then carefully cleaned in an ultrasonic bath and further coated by an outer 2-7 µm thick PVD-coating, preferably comprising one or more layers of $(Ti_xAl_y)N$ where x,y>0 and x+y=1, $(Ti_xAl_ySi_z)N$ where x,y,z>0 and x+y+z=1, $(Ti_xAl_yCr_z)N$ where x,y,z>0 and x+y+z=1, TiN, $Ti(C_xN_y)$ and $Al_2O_3$, most preferably comprising $(Ti_xAl_y)N$ where x,y>0 and x+y=1, obtaining compressive stresses in the range 1000 to 2000 MPa. The process temperature for the used PVD-process should preferably be below 500° C. The PVD-process can be any of the well-known: Arc-technique, Magnetron Sputtering and Ion Plating.

In one embodiment of the invention the process conditions for the PVD-process, e.g. the bias voltage, are selected so that the stress ratio $|\sigma_{PVD\ coating}/\sigma_{CVN\ Ti(CxNy)\ layer(s)}|$ of the final coating is within the range 0.9-1.8. E.g. for an Arc PVD-process of $(Ti_xAl_y)N$ with the ratio x/y near 1, a bias in the range −(40-60) V is selected. For $(Ti_xAl_y)N$ layers with higher Al-content a bias in the range −(80-110) V is generally preferred.

The present invention also relates to a coated cutting tool insert, having a generally polygonal or round shape, or a rotary cutting tool, comprising a cemented carbide substrate of 5-14 wt-% Co, 0-8 wt-% cubic carbides of Ti, Ta or Nb or a combination thereof, and balance WC, having at least one rake face and at least one clearance face said substrate being at least partly coated with a 4-14 µm thick coating comprising an inner 2-7 µm thick CVD coating and an outer 2-7 µm thick PVD coating wherein the CVD coating has compressive stresses, preferably at least on the rake face, achieved by an intensive wet-blasting operation. The CVD coating preferably comprises one or more 1-8 µm, preferably 2-5 µm, thick $Ti(C_xN_y)$ layers, more preferably $Ti(C_xN_y)$ layers with columnar structure, where x,y>0 and x+y=1, having compressive stresses in the range 600 to 1600 MPa, preferably at least on the rake face, and the PVD coating preferably comprises one or more 1-5 µm, preferably 2-4 µm, thick layers of $(Ti_xAl_y)N$ where x,y>0 and x+y=1, $(Ti_xAl_ySi_z)N$ where x,y, z>0 and x+y+z=1, $(Ti_xAl_yCr_z)N$ where x,y,z>0 and x+y+z=1, TiN, $Ti(C_xN_y)$ and $Al_2O_3$, most preferably $(Ti_xAl_y)N$ where x,y>0 and x+y=1, as a single layer or in a multilayer structure, having compressive stresses in the range 1000 to 2000 MPa. The CVD coating may additionally have layers of metal nitrides, carbides or oxides or combinations thereof with the metal elements selected from Ti, Nb, Hf, V, Ta, Mo, Zr, Cr, W and Al, e.g. TiN, $Ti(C_xO_y)$, TiC, $Ti(C_xO_yN_z)$ or TiBN. The total thickness of these additional layers is 0.5 to 4 µm and the individual layer thickness is <1 µm.

All layers in the CVD coating and in the PVD coating possess compressive stresses as measured by XRD using the $\sin^2 \psi$ method.

In one exemplary embodiment the CVD coating consists of an inner 0.1-1 µm $Ti(C_xN_y)$ layer with y>0.8, preferably an MTCVD-TiN layer, and an outer a columnar MTCVD-Ti $(C_xN_y)$ layer.

In another exemplary embodiment the CVD coating consists of an inner 0.1 to <1 µm TiN layer and an outer columnar 2-5 µm thick $TiC_xN_y$ layer, where x,y>0 and x+y=1, and the PVD coating comprises a 2-4 µm thick $(Ti_xAl_y)N$ layer where x,y>0 and x+y=1.

In one embodiment of the invention the stress ratio $|\sigma_{PVD\ coating}/\sigma_{CVD\ Ti(CxNy)\ layer(s)}|$ of the final coating is within the range 0.9-1.8.

The residual stress, σ, of a layer is evaluated by XRD measurements using the well known $\sin^2 \psi$ method as described by I. C. Noyan, J. B. Cohen, Residual Stress Measurement by Diffraction and Interpretation, Springer-Verlag, New York, 1987 (pp 117-130). The measurements shall be performed using $CuK_\alpha$-radiation with a goniometer setup as shown in FIG. 1. The measurements shall be performed on a flat surface, within 2.5 mm from the cutting edge line. The stress is obtained as the average of five measurements. The side-inclination technique (ψ-geometry) with six to eleven ψ-angles, equidistant within a $\sin^2\psi$-range of 0 to 0.5)(ψ=45° should be used. An equidistant distribution of Φ-angles within a Φ-sector of 90° is also preferred. To confirm a biaxial stress state the sample shall be rotated for Φ=0° and 90° while tilted in ψ. In the case of an Euler ¼-cradle this is accomplished by measuring the sample also at Φ=180° and 270° for the different ψ-angles. The $\sin^2 \psi$ method is used to evaluate the residual stress preferably using some commercially available software such as DIFFRAC$^{Plus}$ Stress32 v. 1.04 from Bruker AXS. Locating of the reflection is done by using the Pseudo-Voigt-Fit function. In case of a biaxial stress state the tensile stress is calculated as the average of the obtained biaxial stresses. The following constants are used in the stress calculation:

TABLE 1

| Layer material | Poisson's ratio ν | Young's modulus GPa | Reflection peak |
|---|---|---|---|
| Ti(C,N) | 0.20 | 480 | 422 |
| TiN | 0.22 | 450 | 422 |
| TiAlN, $(Ti_xAl_ySi_z)N$ and $(Ti_xAl_yCr_z)N$ | 0.22 | 450 | 200 |
| α-$Al_2O_3$ | 0.26 | 380 | 416 |

EXAMPLE 1

Insert A

Cemented carbide cutting inserts in style R390-11T308M-PM with the composition 12.6 wt-% Co, 1.25 wt-% TaC, 0.32 wt-% NbC and balance WC were coated with a 0.5 µm thick layer of TiN using conventional CVD-technique at 930° C. followed by a 4 µm $Ti(C_{0.57}N_{0.43})$ layer, employing the MTCVD-technique using $TiCl_4$, $H_2$, $N_2$ and $CH_3CN$ as process gases at a temperature of 840° C. The layer composition was determined by XRD determination of lattice constant and using Vegards Law. After the coating process the reactor temperature was increased to 1010° C. and the inserts were heat treated for 2 hours in an $N_2/H_2$ atmosphere.

XRD stress measurement showed tensile stresses of the $Ti(C_{0.57}N_{0.43})$ layer in the range 600 to 700 MPa.

Insert B (Prior Art)

Inserts A were wet-blasted on the rake face with an $Al_2O_3$/water-slurry at 2.7 bars pressure. XRD stress measurement showed a compressive stress level in the range 1200 to 1600 MPa. The blasted coated surfaces were investigated in SEM (Scanning Electron Microscope) and almost no cooling cracks were visible on the deformed coating surface.

Insert C (Invention)

Inserts B were ion-etched for 30 min and coated with a 3 µm $(Ti_xAl_y)N$ with the ratio x/y close to 1 using an Arc-based PVD-technique with a bias voltage of −40 V and a process temperature of 490° C. After the PVD-process the stresses in the Ti($C_{0.57}N_{0.43}$) and (Ti$_{0.5}$Al$_{0.5}$)N layers were measured and found both to be compressive and within 1000 to 1400 MPa and 1300 to 1800 MPa, respectively.

Insert D (Prior Art)

Inserts A were coated with a 3 μm (Ti$_x$Al$_y$)N using the same PVD-process as for Insert C. After the PVD-process the stresses of the Ti($C_{0.57}N_{0.43}$) and the (Ti$_{0.5}$Al$_{0.5}$)N layer were measured and found to tensile within 700 to 900 MPa and compressive within 1300 to 1600 MPa, respectively.

Insert E (Outside Invention)

Inserts A were coated with a 3 μm (Ti$_x$Al$_y$)N using the same PVD-process as for Insert C. After the PVD-process the stresses of Ti($C_{0.57}N_{0.43}$) and the (Ti$_{0.5}$Al$_{0.5}$)N layer were measured and found to tensile within 700 to 900 MPa and compressive within 1300 to 1600 MPa, respectively. The insert were subjected to an intensive wet-blasting operation on the rake face with an Al$_2$O$_3$/water-slurry at 6.2 bars pressure to obtain the desired compressive stress. The stresses of Ti($C_{0.57}N_{0.43}$) and the (Ti$_{0.5}$Al$_{0.5}$)N layer were measured and found to be compressive within 600 to 700 MPa. However, the insert obtained severe flaking and damages on the outer PVD coating, as well as damages on the cutting edge, during the blasting process, due to the high blasting pressure necessary to obtain the required compressive stresses. Inserts E were therefore excluded from any further testing.

The residual stress was evaluated using ψ-geometry on an X-ray diffractometer Bruker D8 Discover-GADDS equipped with laser-video positioning, Euler ¼-cradle, rotating anode as X-ray source (CuK$_\alpha$-radiation) and an area detector (Hi-star). A collimator of size 0.5 mm was used to focus the beam. Eight ψ tilts between 0° and 70° were performed for each Φ-angle. The $\sin^2 \psi$ method was used to evaluate the residual stress using the software DIFFRAC$^{Plus}$ Stress32 v. 1.04 from Bruker AXS with the constants according to table 1 and locating the reflection using the Pseudo-Voigt-Fit function. A biaxial stress state was confirmed and the average value was used as the residual stress value. All measurements were performed on a flat surface, within 2.5 mm from the cutting edge line on the rake face.

EXAMPLE 2

Inserts B, C and D from Example 1 were tested in two milling cutting operations, both very demanding on toughness properties. The following conditions were used:

Cutting Test 1:

A milling operation in an alloyed steel SS2541 was performed. The work-piece was a rectangular block. The milling cutter entered the work-piece a number of times from its long side, conditions classified as a "difficult entrance".

| Dry condition | |
|---|---|
| Cutting speed | V = 200 m/min |
| Feed per tooth | Fz = 0.17 mm/Z |
| Axial depth of cut | Ap = 3 mm |
| Radial depth of cut | Ae = 16 mm |
| Number of teeth = | 1 |

Three inserts (one edge per insert) were run over the work-piece. The lifetime expressed as number of entrances that could be completed before chipping of the edge occurred is given in Table 2 below.

TABLE 2

Number of entrances that could be completed before breakage

| Cutting test | Insert C CVD + blasting + PVD (invention) | Insert B CVD + blasting (prior art) | Insert D CVD + PVD (prior art) |
|---|---|---|---|
| No 1 | 29 | 18 | 8 |

Cutting Test 2:

A milling operation in an alloyed steel SS2244 was performed. The shape of the work-piece was a thin long bar with a thickness much smaller than the diameter of the milling cutter. The milling cutter passed the bar longitudinally, conditions classified as a "difficult exit".

| Wet condition | |
|---|---|
| Cutting speed | V = 150 m/min |
| Feed per tooth | Fz = 0.15 mm/Z |
| Axial depth of cut | Ap = 3 mm |
| Radial depth of cut | Ae = 7 mm |
| Number of teeth = | 2 |

3×2 inserts (one edge/insert) were run over the work-piece. The lifetime expressed as number of bars that could be completed before breakage of the edges occurred is given in Table 3 below.

TABLE 3

Number of bars that could be completed before breakage

| Cutting test | Insert C CVD + blasting + PVD (invention) | Insert B CVD + blasting (prior art) | Insert D CVD + PVD (prior art) |
|---|---|---|---|
| No 2 | 26 | 20 | 10 |

The results from the cutting tests clearly show that the overall best toughness performance is achieved with the inserts produced according to the invention, Insert C.

The invention claimed is:

1. Method of producing a cutting tool at least partly coated with an inner CVD coating and an outer PVD coating comprising the manufacturing steps of depositing the CVD coating, subjecting the CVD coating at least partly to an intensive wet-blasting operation, followed by depositing the PVD coating.

2. The method of claim 1 comprising performing a diffusion promoting heat treating step at 980 to 1030° C. for 1-4 h in an H$_2$/N$_2$-atmosphere, after depositing the CVD coating but before the intensive wet-blasting operation.

3. The method according to claim 1 comprising depositing one or more Ti($C_xN_y$) layers in the CVD coating.

4. The method according to claim 3 comprising performing the blasting operation such that the one or more Ti($C_xN_y$) layers obtain compressive stresses in the range 600 to 1600 MPa.

5. The method according to claim 4 comprising performing the blasting operation using a slurry consisting of F220 grits of $Al_2O_3$ in water at an air pressure of 2.3 to 3.2 bar.

6. A coated cutting tool insert comprising a cemented carbide substrate of 5-14 wt-% Co, 0-8 wt-% cubic carbides of Ti, Ta or Nb or a combination thereof, and balance WC, said substrate being at least partly coated with a 4-14 μm thick coating comprising an inner CVD coating and an outer PVD coating, wherein the CVD coating comprises one or more 1-8 μm thick $Ti(C_xN_y)$ layers, where x,y>0 and x+y=1, having compressive stresses in the range 600 to 1600 MPa.

7. A coated cutting tool insert comprising a cemented carbide substrate of 5-14 wt-% Co, 0-8 wt-% cubic carbides of Ti, Ta or Nb or a combination thereof, and balance WC, said substrate being at least partly coated with a 4-14 μm thick coating comprising an inner CVD coating and an outer PVD coating, wherein the CVD coating has compressive stresses and wherein the PVD coating comprises one or more of $(Ti_xAl_y)N$ where x,y>0 and x+y=1, $(Ti_xAl_ySi_z)N$ where x,y,z>0 and x+y+z=1, $(Ti_xAl_yCr_z)N$ where x,y,z>0 and x+y+z=1, TiN, $Ti(C_xN_y)$ and $Al_2O_3$.

8. The coated cutting tool insert according to claim 6 wherein the CVD coating has additional layers of metal nitrides, carbides or oxides or combinations thereof with the metal elements selected from Ti, Nb, Hf, V, Ta, Mo, Zr, Cr, W and Al.

9. The coated cutting tool insert according to claim 6 wherein the $Ti(C_xN_y)$ layers are 2-5 μm thick.

* * * * *